US007017815B2

(12) United States Patent
Wood

(10) Patent No.: US 7,017,815 B2
(45) Date of Patent: Mar. 28, 2006

(54) COMPACT EXTERNALLY-DRIVEN SCANNER

(75) Inventor: Frederick F. Wood, Medford, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 941 days.

(21) Appl. No.: 09/845,347

(22) Filed: May 1, 2001

(65) Prior Publication Data

US 2002/0162888 A1 Nov. 7, 2002

(51) Int. Cl.
*G06K 7/10* (2006.01)

(52) U.S. Cl. .................................................. 235/462.14

(58) Field of Classification Search ............ 235/462.14, 235/462.43, 472

See application file for complete search history.

(56) References Cited

U.S. PATENT DOCUMENTS 4,983,818 A * 1/1991 Knowles ................ 235/462.47
5,015,831 A * 5/1991 Eastman et al. ....... 235/462.36
5,144,120 A 9/1992 Krichever et al.
5,410,140 A * 4/1995 Bard et al. ............. 235/462.33
5,866,894 A * 2/1999 Bard et al. ............. 235/462.01
6,062,476 A * 5/2000 Stern et al. ............ 235/462.35
6,141,436 A * 10/2000 Srey et al. .................. 382/124
6,195,053 B1 * 2/2001 Kodukula et al. .......... 343/702

FOREIGN PATENT DOCUMENTS

EP 0 731 417 9/1996

* cited by examiner

*Primary Examiner*—Thien M. Le
*Assistant Examiner*—Lisa M Caputo
(74) *Attorney, Agent, or Firm*—Carter, DeLuca, Farelll & Schmidt, LLP

(57) ABSTRACT

A device, arrangement, and scanner are provided which are compact, reliable, and cost effective. The device is generally of the type in which a moving beam is scanned along a target object, and light reflected from the target object is detected and analyzed by the device. The device is preferably mirrorless. In addition, the device preferably lacks an integrated scanning component which imparts motion to the beam. In this regard, the device is provided with components for interacting with a separate adjacent scanning component, as well as a flexible connection device.

55 Claims, 6 Drawing Sheets

COMPACT EXTERNALLY-DRIVEN SCANNER

BACKGROUND OF THE INVENTION

The present invention relates to methods and apparatus for electro-optically scanning and/or reading symbols. The present invention is further directed to scanners which are preferably mirror-less, and their use with and/or incorporation into existing devices, such as cell phones, pagers, personal data assistants (PDA's), and the like.

In scanning and reading systems known in the art, a light beam is directed by a lens or other optical components along the light path toward a target, such as a bar code symbol. The light source is typically a gas or semiconductor laser. The use of semiconductor devices as the light source is especially desirable because of their small size, low cost and low voltage requirements. The laser beam is optically modified, typically by an optical assembly, to form a beam spot of a certain size at the target distance. A moving-beam scanner operates by repetitively scanning the light beam in a line, pattern or series of lines across the target by means of imparting motion to the light beam through use of a scanning component. Such mechanisms frequently employ a mirror disposed in the optical path of the light beam.

Bar code reading systems also include a sensor or photo detector which detects light reflected or scattered from the target symbol. The photo detector or sensor is positioned in the scanner in an optical path so that it has a field of view which ensures the capture of a portion of the light which is reflected or scattered off the symbol. This light is detected and converted into an electrical signal. Electronic circuitry and software decode the electrical signal into a digital representation of the data represented by the symbol that has been scanned. For example, the analog electrical signal generated by the photo detector is converted by a digitizer into a pulse or modulated digitized signal, with the widths corresponding to the physical widths of the bars and spaces. Such a digitized signal is then decoded, based on the specific symbology used by the symbol, into a binary representation of the data encoded in the symbol, and subsequently to the information or alphanumeric characters so represented.

However, conventional moving-beam scanners and readers possess certain disadvantages. In some laser scanning applications, mirror movements have been found to be undesirable.

EP 0 731 417, the disclosure of which is incorporated herein by reference in its entirety, describes and number of embodiments and ways of generating a scanning beam. For instance, EP 0 731 417 discloses arrangements that include oscillating mirrors, oscillating substrates which include the scanning beam source, and arrays of light sources that are activated in a way that mimics a scanning beam. With regard to the embodiment of EP 0 731 417 that physically moves the laser light generator within the device, there is disclosed a laser light-generating diode disposed on a substrate, the substrate being mounted on rotatable hinges within a relatively stationary housing.

U.S. Pat. No. 5,144,120 to Krichever et al., the disclosure of which is incorporated herein by reference in its entirety, discloses mirrorless scanners with moveable laser, optical and sensor components. More particularly, Krichever et al. discloses scanning devices that include a drive means for repetitive movement about an axis or in a plane within the device to effect scanning.

Although the abovementioned documents embody important advances in the art, incorporation of a means for imparting motion to the light beam generator itself, or to reflecting mirrors, (i.e.—the "scanning component") into the scanner/reader itself adds size, cost and complexity to the device.

Thus, there is a need for a more compact and versatile scanner which is simply and inexpensively fabricated. Moreover, there is a need for such a scanner that can be easily incorporated into or associated with other devices.

SUMMARY OF THE INVENTION

Accordingly, it is an object of the present invention to provide a compact and versatile scanner/reader which is simply and inexpensively fabricated.

It is another object of the present invention to provide a scanner/reader which functions as a moving beam device, but does not have a scanning component per se, or a mirror, as an integrated part of the device.

It is a further object of the present invention to provide a scanner/reader with a construction which is versatile, compact and can be easily associated and utilized with other devices, such as cell phones, pagers, personal data assistants, etc.

According to one aspect, the present invention provides a device comprising: means for providing an oscillating magnetic field; a printed circuit board; a moving beam scanner, the scanner comprising: a substrate; a laser light source mounted to the substrate; at least one light receiving photodiode mounted to the substrate; a cap mounted over the substrate; a lens for focusing the laser light source onto a target; a lens for collecting light reflected from the target; means mounted to the scanner for interacting with the means for providing an oscillating magnetic field; at least one flexible connector mechanically and electrically coupling the scanner and the circuit board such that a range of oscillation between the scanner and the circuit board is possible; and wherein the scanner lacks a mirror and a scanning component.

According to a further aspect, the present invention provides, in combination, a moving-beam scanner and a scanning component for imparting motion to the beam: the scanner comprising: a substrate; a light source mounted to the substrate; at least one light-receiving photodiode mounted to the substrate; a cap mounted over the substrate; a lens for focusing the light source onto a target; a lens for collecting light reflected from the target; means mounted to the scanner for interacting with the scanning component; and wherein the scanning component is positioned adjacent to and outside the cap.

According to another aspect, the present invention provides a moving-beam scanner comprising: a light source; at least one light-receiving photodiode; lens means for focusing the light source onto a target and collecting light reflected from the target; housing means; and means associated with the scanner for interacting with a scanning component to impart motion to the beam while maintaining the light source, lens means, and housing means fixed relative to each other; wherein the housing means lacks a mirror.

DETAILED DESCRIPTION OF THE INVENTION

Figure 1:
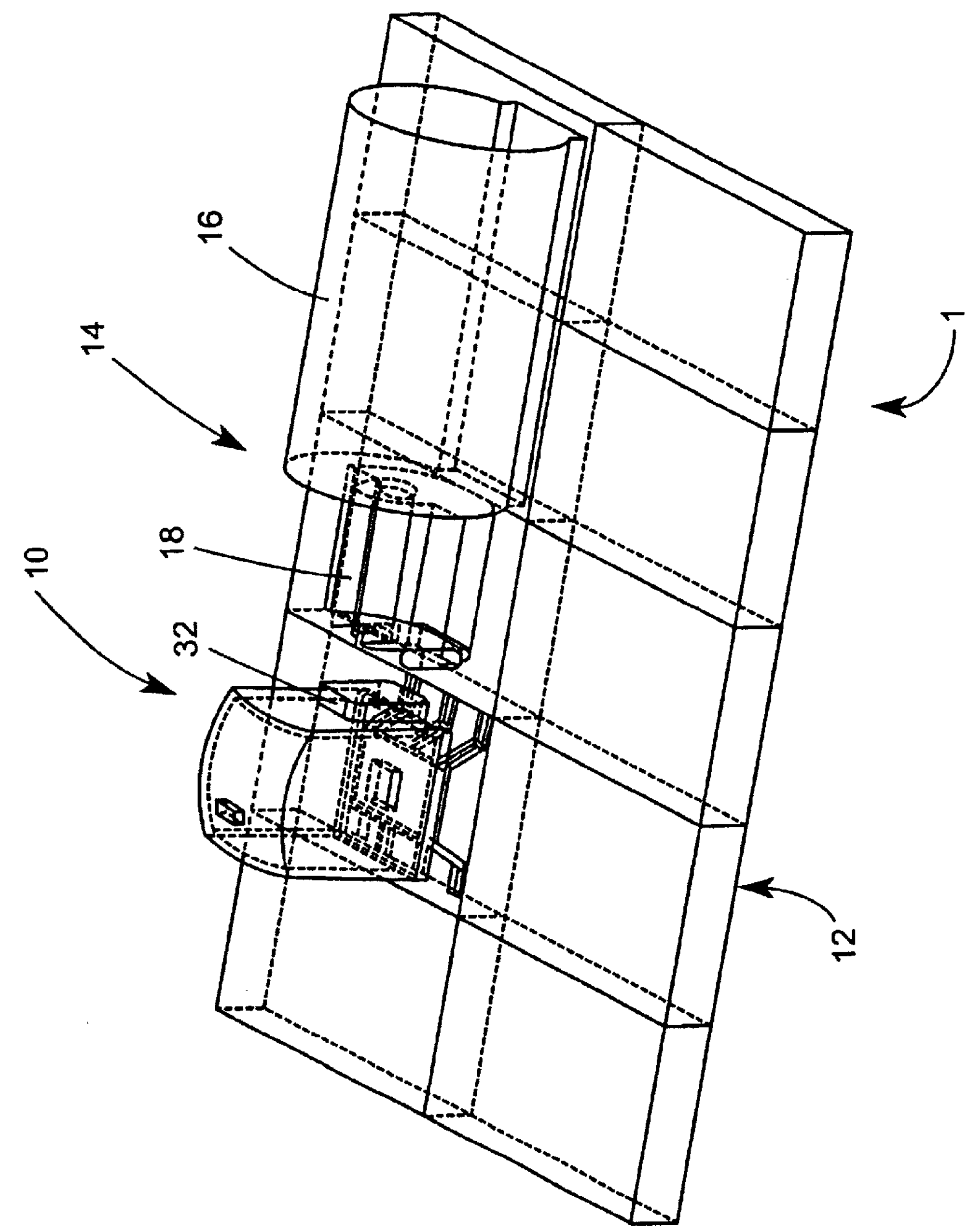
FIG. 1 is a perspective view of an arrangement constructed according to the principles of the present invention.

A device 1 constructed according to the principles of the present invention is embodied in FIG. 1. The term "device" is intended as a generic term which encompasses numerous assemblies and subassemblies of components for carrying out a particular function. By way of example, the device 1 could be a cell phone, pager, personal data assistant, or subassembly thereof. This list of devices is not exhaustive. It will be evident from the present description that the principles of the present invention could be successfully incorporated into other devices or subassemblies as well.

The arrangement depicted in FIG. 1 generally includes a scanner or reader 10. The term "scanner" and "reader" are intended to encompass a device which can at least receive a target reflection. The reflection image may then be converted to electrical signals which may be transferred to other devices, or further manipulated by the scanner 10 itself. For example, scanner 10 can be used to read a bar code which is such that the data contained therein is interpreted, as is known in any manner known to those of ordinary skill in the art.

In the embodiment depicted in FIG. 1, the scanner 10 is associated in combination with a scanning component 14. The term "scanning component" is intended as a generic term representing a device which is capable of imparting motion or a "scanning" action to the scanner 10. In the illustrated embodiment, the scanning component 14 comprises a means for providing an oscillating magnetic field, such as a vibration motor 16 which includes an oscillating magnet 18. Such motors are frequently incorporated into devices such as cell phones and pagers as a means of alerting the user to incoming messages, without resorting to the use of audible signals. However, other devices are contemplated, so long as the requisite external oscillating magnetic field is produced.

Both the scanner 10 and the scanning component 14 are associated with a printed circuit board 12, or similar component, of the device 1.

Further details of a scanner formed consistent with the principles of the present invention are illustrated by reference to FIGS. 2–5.

The scanner 10 preferably includes a suitable substrate 20. Substrate 20 can assume any suitable form which is mechanically and electrically suitable for connecting the scanner 10 and its various components to the device 1, via the printed circuit board 12. For instance, in certain embodiments substrate 20 can be in the form of a small printed circuit board having dimensions on the order of approximately 4 mm×4 mm. As readily apparent, scanner 10 is very small and compact in size.

As noted above, in order to provide a compact, yet reliable and cost effective scanner 10, the present invention has been able to provide such a construction through various design features. For instance, it should be noted that scanner 10 does not include a mirror or reflective component which is used to reflect a light source onto a target image. By excluding a mirror or similar reflective component from the scanner 10, allows a reduction in the overall size of the scanner 10, as well as a less complex and more cost effective device.

According to the present invention, further advantages are obtained by constructing the scanner 10 such that the scanning component 14 is not integrated therewith. In other words, scanning component 14 is actually a separate component from the scanner 10. However, scanner 10 is designed such that it interacts with scanning component 14 in a manner which provides or imparts the desired scanning motion to the light source of scanner 10. The interaction means between scanner 10 and scanning component 14 may include mechanical means, magnetic means, or any other suitable arrangement.

Returning to the features of the scanner 10 per se, a light source 22 is mounted to the substrate 20. Light source 22 can be any suitable light source. As noted above, a semiconductor laser is often a preferred light source. In this regard, light source 22 may comprise a VCSEL laser chip as described in EP 0 737 417.

Figure 2:
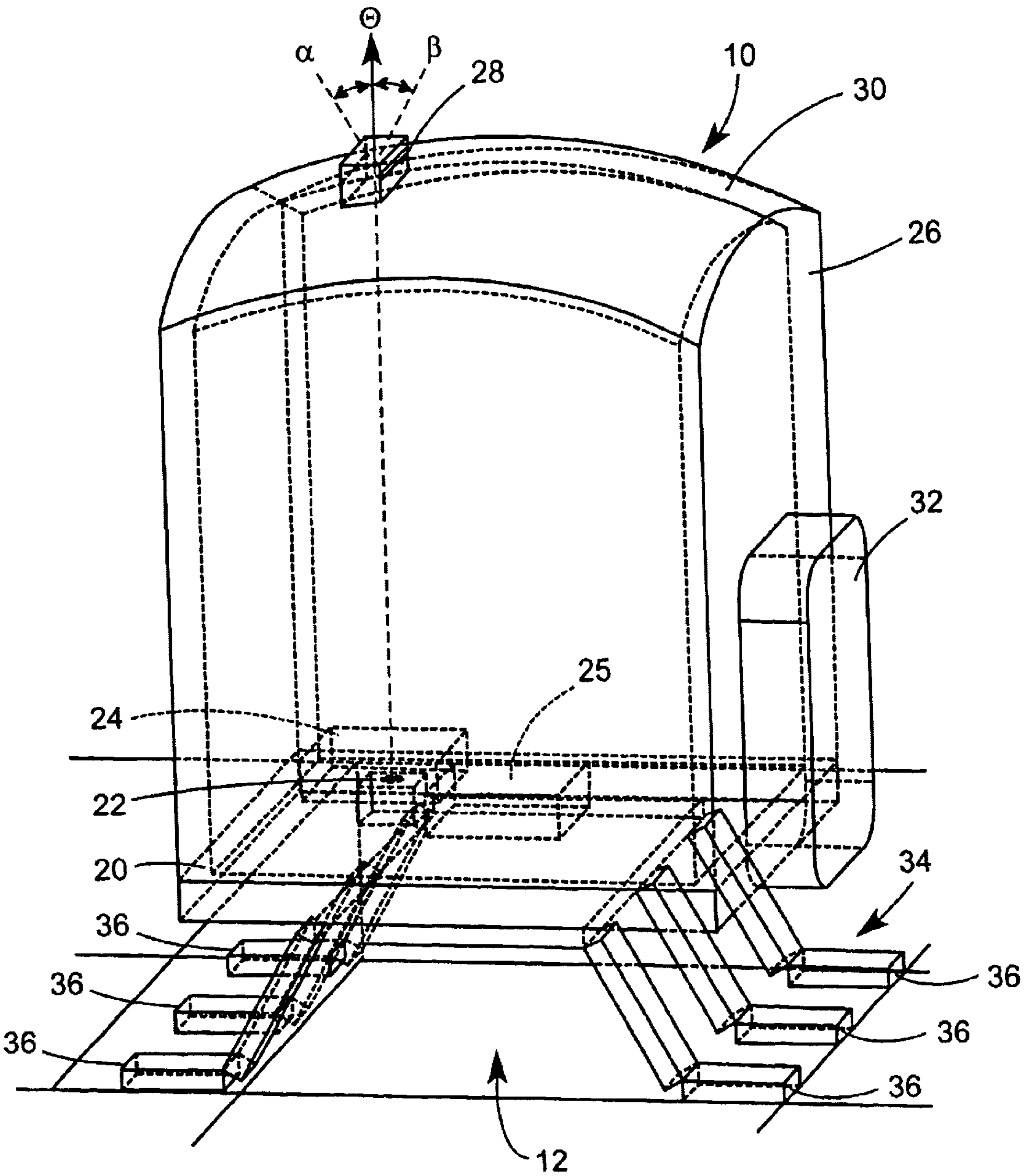
FIG. 2 is a further perspective view of the arrangement of FIG. 1.

The light source 22 produces a light beam which, in a state in which the scanner 10 is not being oscillated, i.e.—a state of rest, is substantially normal to a plane defined by a surface of the substrate 20, and which is represented as Θ in FIG. 2.

Scanner 10 is further provided with a mechanism for receiving reflections off a target. According to the embodiments depicted in FIGS. 2–5, this function may be provided by at least one light receiving detector. In certain embodiments, there is a plurality of light receiving detectors 24, 25. These detectors may comprise photodiodes or a CCD device.

Scanner 10 is also provided with a housing means. In the illustrated embodiment, housing means comprises a cap member 26 which at least partially covers substrate 20. The cap may be formed from any suitable material and may have any suitable shape. In the embodiments depicted in the drawing figures, the cap may be formed from a plastic material, and may be generally rectangular with an arcuate or domed top.

Scanner 10 is also provided with lens means which cooperate with the light source, as well as with light reflected from the target image in order to provide the desired optical functions of the scanner 10. The lens means preferably comprises an arrangement of lenses to accomplish this. In the embodiments depicted in FIGS. 2–5, the lens means comprises a first focusing lens 28 which receives light from the light source 22 and transmits the light source to the target. The lens means may further comprise a collection lens 30, which may comprise the domed top of the cap 26, for collecting light reflected off the target. The collected light is then transmitted to the light receiving means or light receiving photodiodes 24, 25.

The scanner 10 may further comprise means for interacting with the scanning component 14. As previously noted, the means for interacting with the scanning component may comprise any suitable arrangement or connection. The arrangement or connection may be either mechanical-based, magnetic, or electro-magnetic. In the embodiments illustrated in FIGS. 2–5, the means for interacting with the scanning component comprises a magnet 32. The magnet 32 can be mounted to the cap 26 as shown, or may alternatively be mounted to the substrate 20 or any other part of the scanner 10 such that it can effectively interact with the scanning component 14.

During operation of the vibration motor 16, magnet 18 rotates or oscillates. The movement of the magnet 18 interacts with the magnet 32 in a manner which excites the scanner 10. An AC signal is sent to the motor 16 to drive the magnet 18 at the proper speed. In other words, the motor is driven in a manner which causes the magnet to rotate at a speed sufficient to reach the resonant frequency of the scanner 10 via magnet 32.

The above-described interaction imparts an oscillatory movement to the scanner 10 as a whole. This movement in turn causes the light or beam emitted from the light source 22 to travel back and forth across a target. The movement of the beam emitted from the light source 22 is accomplished without the use of a mirror or similar reflective component, and without the necessity of incorporating or integrating a scanning component within the scanner 10 itself.

Moreover, the desired scanning motion is imparted to the scanning beam, with the assistance of flexible connections described in further detail below, while maintaining the light source 22, focusing lens 28, and housing or cap 26 fixed relative to each other. This construction is beneficial from the standpoints of compactness, simplicity, and avoiding aberrations which can result from shifting the lens relative to the light source.

The type and range of oscillation of the scanner 10 is determined based upon various factors. Such factors could include the size of the target, location of the target relative to the scanner 10, as well as the distance normally present between the scanner 10 and the target.

Figure 3:
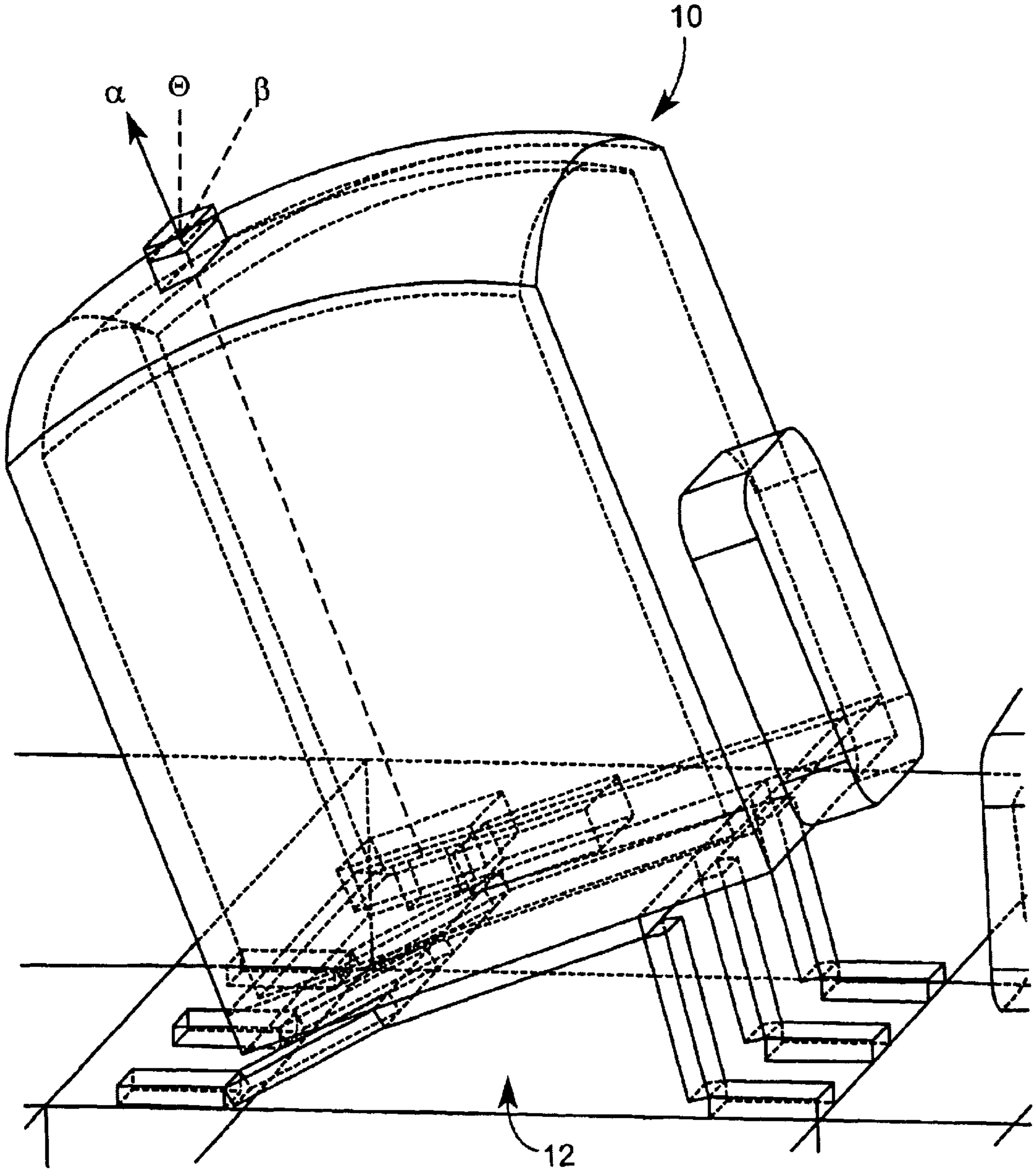
FIG. 3 is a further perspective view similar to FIG. 2 illustrating operation of the arrangement of the present invention.
Figure 4:
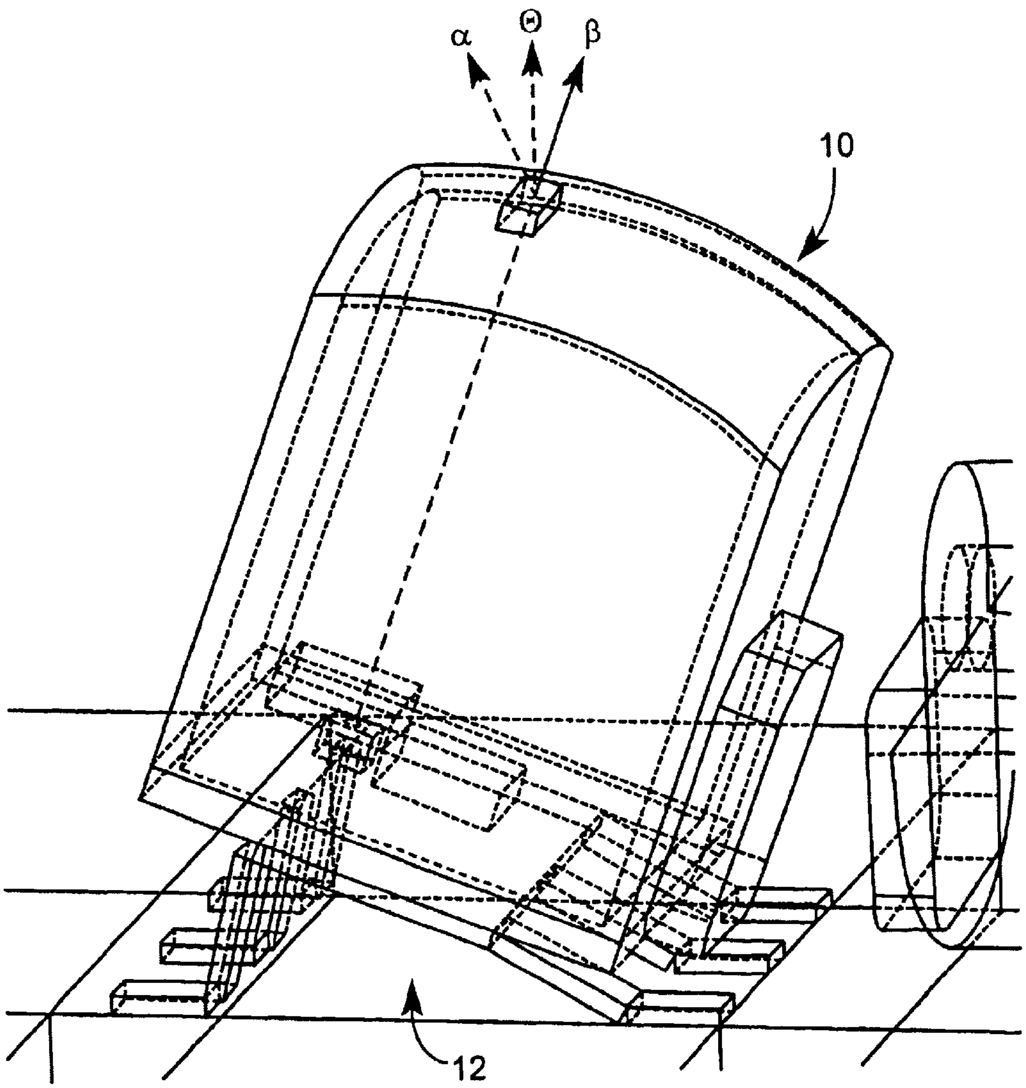
FIG. 4 is a perspective view similar to FIG. 3.

For example, it has been determined that providing a scanner 10 with a range of oscillation, when measured relative to the beam Θ while at rest to be on the order of +/−20°. This range of oscillation is illustrated in FIGS. 2–4 and most clearly shown in FIGS. 3 and 4 as α and β, respectively.

The scanner 10 must be flexibly coupled to the device 1 via the printed circuit board or similar component 12. The means for attaching the scanner 10 could encompass numerous mechanical and/or mechanical/electrical arrangements. In the embodiment illustrated in FIG. 2, the flexible connection 34 includes at least one flexible connector or hinge 36. In the illustrated embodiment, there are a plurality of flexible connectors or hinges 36. While the number of hinges can vary according to the principles of the present invention, it is possible to utilize five or six such connections 36. The flexible members or hinges 36 are preferably fastened to the substrate 20 as well as the printed circuit board 12 of the device 1. The hinges 36 can be connected in any suitable manner, such as adhesive, welding, or through the use of fasteners. Preferably, the hinges 36 also provide an electrical connection between the substrate 20 and the printed circuit board 12.

Figure 6:
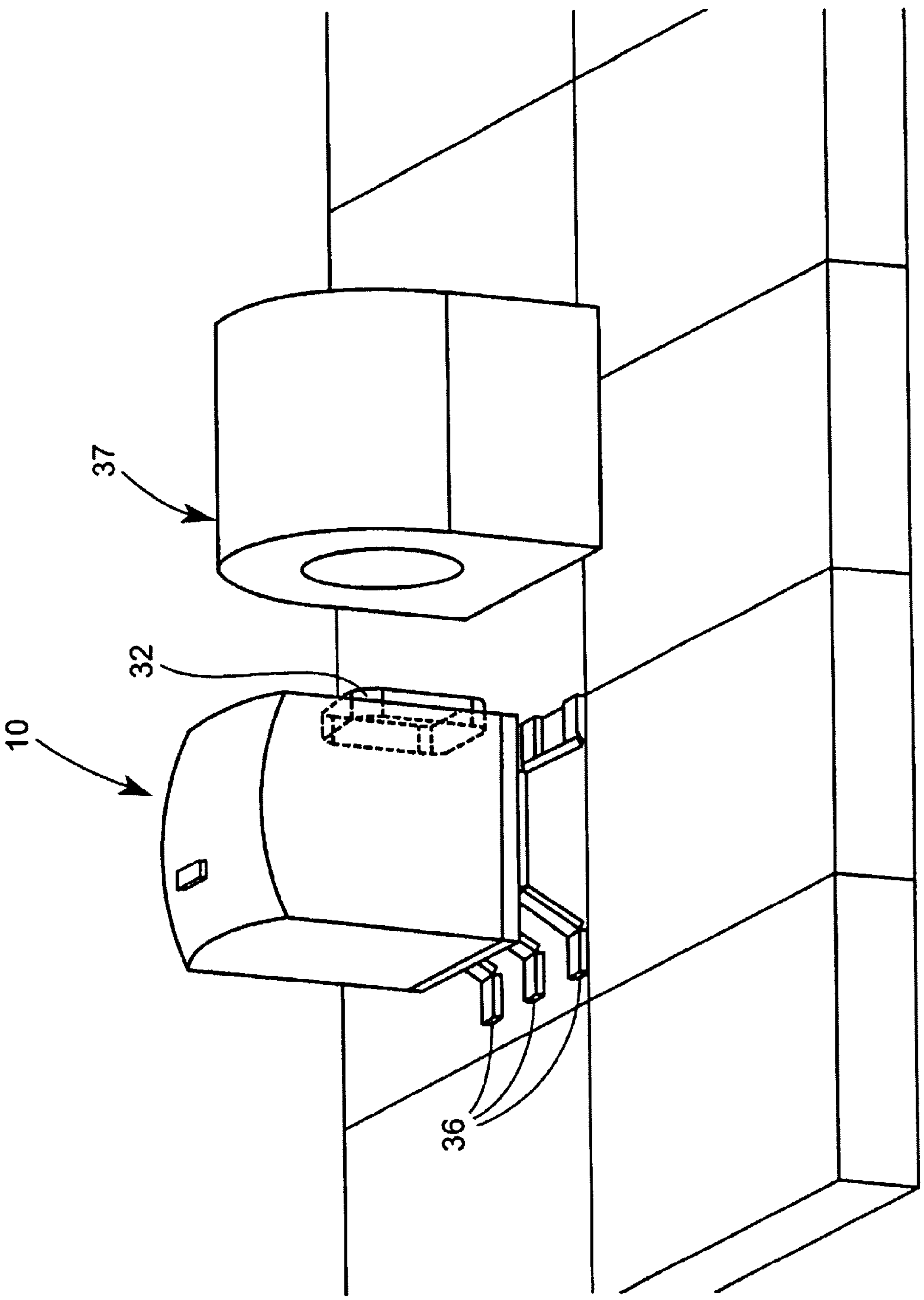
FIG. 6 is a perspective view of a further arrangement consistent with the principles of the present invention.

Although the above-described embodiment has been described in connection with a device which already includes a vibration motor 16, it is well within the scope of the present invention to incorporate a scanner 10 into a device which does not include such a motor. When seeking to incorporate scanner 10 in a device which lacks a vibration motor, or similar component, it is possible to associate the scanner 10 with a proper scanning component or means for imparting a scanning motion to the scanner 10. Examples of such means include a conventional electromagnetic coil 37 or similar device, which is preferably external to the scanner 10 as shown in FIG. 6.

Figure 5:
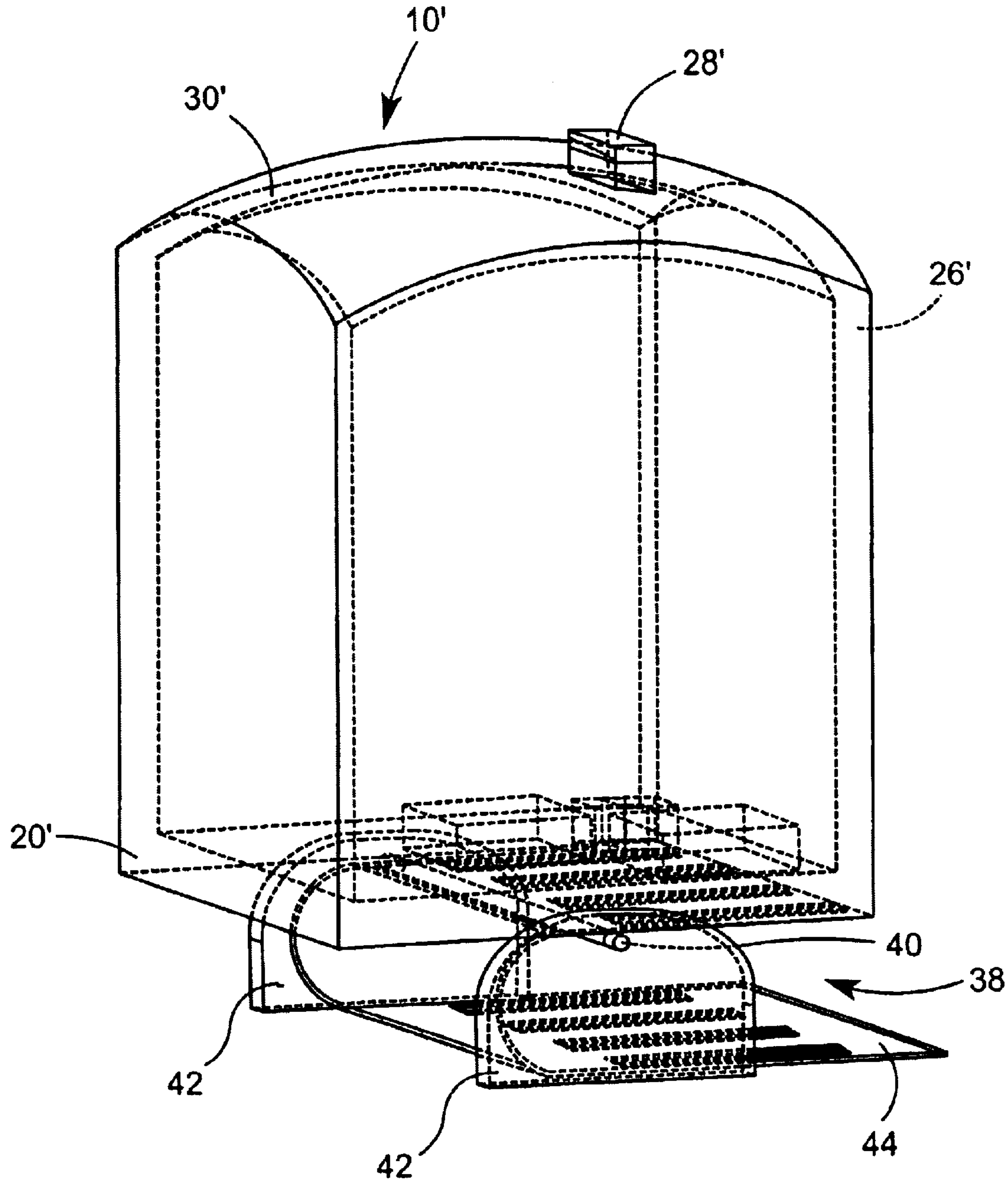
FIG. 5 is a perspective view of an alternative arrangement according to the principles of the present invention.

FIG. 5 illustrates an alternative construction form according to the principles of the present invention. Like reference numerals have been utilized to identify those features in common with the embodiments depicted in FIGS. 2–4. In general, the scanner 10' is constructed in the same manner previously described and includes the same components. An alternative arrangement for flexibly connecting the scanner 10 to the device 1 via printed circuit board 12, or similar component, is illustrated generally as reference element 38. The flexible connection 38 is generally in the form of a mechanical pivot. In the illustrated embodiment, the mechanical pivot comprises a rotatable shaft 40 which is mounted within bracket holders 42 for support. A flexible connector 44 is electrically and mechanically attached to the scanner 10, preferably via the bottom of substrate 20', as well as a printed circuit board or similar component of the device 1. The flexible connector 44 can take any suitable form. In the illustrated embodiment, flexible connector 44 comprises a ribbon-type element. Through this flexible connection 38, the scanner 10 is capable of oscillating in the desired manner, as previously described, when interacting in a proper way with a scanning component.

While the present invention has been described by reference to the above-mentioned embodiments, certain modifications and variations will be evident to those of ordinary skill in the art. Therefore, the present invention is limited only by the scope and spirit of the appended claims.

I claim:

1. A device comprising:

means for providing an oscillating magnetic field;

a printed circuit board;

a moving beam scanner, the scanner comprising:

a substrate;

a laser light source mounted to the substrate;

at least one light receiving photodiode mounted to the substrate;

a cap mounted over the substrate;

a lens for focusing the laser light source onto a target;

a lens for collecting light reflected from the target;

means mounted to the scanner for interacting with the means for providing an oscillating magnetic field; and at least one flexible connector mechanically coupling the scanner and the circuit board such that a range of oscillation between the scanner and the circuit board is possible due to the oscillating magnetic field and at least one flexing action of said at least one flexible connector.

2. The device of claim 1, wherein the device is a mobile phone, pager, or personal data assistant.

3. The device of claim 1, wherein the substrate comprises a printed circuit board having an area of approximately 4×4 mm.

4. The device of claim 1, wherein the laser light source comprises a VCSEL laser chip.

5. The device of claim 1, wherein the at least one light receiving photodiode comprises a CCD device.

6. The device of claim 1, wherein the cap, focusing lens and receiving lens are formed of plastic.

7. The device of claim 1, wherein the magnet is mounted to the cap.

8. The device of claim 1, wherein the magnet is mounted to the substrate.

9. The device of claim 1, wherein the at least one flexible connector comprises a plurality of resilient spring-like members, one end of each member attached to the printed circuit board and the other end attached to the scanner.

10. The device of claim 9, wherein the other end of each member is attached to the substrate.

11. The device of claim 9, wherein there are at least 5 members.

12. The device of claim 1, wherein the range of oscillation is +/−20° relative to a central rest position.

13. The device of claim 1, wherein the means for providing an oscillating magnetic field comprises a vibration motor and the means mounted to the scanner for interacting comprises a magnet mounted to the cap, wherein the vibration motor is arranged externally relative to the cap.

14. The device of claim 1, wherein the scanner is oscillated such that the laser light source, focusing lens and cap remain fixed relative to each other.

15. The device of claim 1, wherein the at least one flexible connecter electrically couples the scanner and the printed circuit board.

16. A moving-beam scanner and a scanning component combination for imparting motion to a light beam:

the scanner located at a non-contact distance from the scanning component, the scanner comprising:

a substrate;

a light source mounted to the substrate for generating a light beam;

at least one light-receiving photodiode mounted to the substrate;

a cap mounted over the substrate;

a lens for focusing the light beam onto a target;

a lens for collecting light reflected from the target;

at least one flexible connector configured to mechanically couple the scanner to a surface such that a range of motion between the scanner and the surface is possible through at least one flexing action of said at least one flexible connector for imparting motion to the light beam; and means mounted to the scanner for interacting with the scanning component via the non-contact distance;

wherein the scanning component is positioned adjacent to and outside the cap.

17. The combination of claim 16, wherein the scanner lacks a mirror.

18. The combination of claim 16, wherein the scanning component comprises a vibration motor having an oscillating magnet.

19. The combination of claim 18, wherein the means mounted to the scanner for interacting with the scanning component comprises a magnet.

20. The combination of claim 16, wherein the scanning component comprises an electromagnetic coil.

21. The combination of claim 16, wherein the at least one flexible connector comprises a mechanical pivot.

22. The combination of claim 16, wherein the at least one flexible connector is formed from a spring-like, elastic or other spatially-deformable structure.

23. The combination of claim 16, wherein the substrate comprises a printed circuit board having an area of approximately 4×4 mm.

24. The combination of claim 16, wherein the light source comprises a VCSEL laser chip.

25. The combination of claim 16, wherein the at least one light receiving photodiode comprises a CCD device.

26. The combination of claim 16, wherein the cap, focusing lens and receiving lens are formed of plastic.

27. The combination of claim 16, wherein the means for interacting with the scanning component is mounted to the cap.

28. The combination of claim 16, wherein the means for interacting with the scanning component is mounted to the substrate.

29. The combination of claim 16, herein the scanner is capable of range of oscillation of +/−20° relative to a central rest position.

30. The combination of claim 16, wherein the at least one flexible connector electrically couples the scanner to the surface.

31. A moving-beam scanner comprising:

a light source for generating a light beam;

at least one light-receiving photodiode;

lens means for focusing the light source onto a target and collecting light reflected from the target;

housing means; and means associated with the scanner for non-contact interaction with a scanning component to impart motion to the light beam while maintaining the light source, lens means and housing means fixed relative to each other;

wherein said motion is imparted to the light beam by a non-manual force on at least one flexible connector.

32. The scanner of claim 31, further comprising a substrate.

33. The scanner of claim 32, wherein the at least one flexible connector comprises a plurality of resilient spring-like members, one end of each of the members attached to the substrate.

34. The scanner of claim 33, wherein there are at least 5 members.

35. The scanner of claim 32, wherein the at least one flexible connector is attached to the substrate.

36. The scanner of claim 32, wherein the means associated with the scanner comprises a magnet, the magnet is mounted to the substrate.

37. The scanner of claim 32, wherein the substrate comprises a printed circuit board having an area of approximately 4×4 mm.

38. The scanner of claim 32, wherein the housing means comprises a cap mounted over the substrate.

39. The scanner of claim 38, wherein the cap and lens means are formed of plastic.

40. The scanner of claim 38, wherein the means associated with the scanner comprises a magnet, the magnet is mounted to the cap.

41. The scanner of claim 31, wherein the light source comprises a VCSEL laser chip.

42. The scanner of claim 31, wherein the at least one light-receiving photodiode comprises a CCD device.

43. The scanner of claim 31, wherein the lens means comprises a lens for focusing the light beam onto a target and a lens for receiving light reflected from the target.

44. The scanner of claim 31, wherein the means associated with the scanner comprises a magnet and a plurality of flexible connectors attached to the scanner, said plurality of flexible connectors including the at least one flexible connector.

45. The scanner of claim 31, wherein the at least one flexible connector comprises a mechanical pivot.

46. The scanner of claim 31, wherein the at least one flexible connector is attached to the scanner.

47. The scanner of claim 31, wherein the at least one flexible connector comprises a plurality of resilient spring-like members, one end of each of the members attached to the scanner.

48. A light beam scanning assembly comprising:

a scanner comprising means for generating a light beam and means for receiving reflected light from a target; and a scanning component located at a non-contact distance from said scanner and comprising means for generating a non-manual force, wherein said non-manual force causes oscillatory motion of said scanner during a scanning procedure for imparting motion to said light beam.

49. The assembly of claim 48, wherein the means for generating the non-manual force comprises a vibration motor having an oscillating magnet.

50. The assembly of claim 48, wherein the scanner further comprises means for interacting with the scanning component via the non-contact distance.

51. The assembly of claim 50, wherein the means for interacting includes a magnet.

52. The assembly of claim 48, wherein the scanning component further comprises an electromagnetic coil.

53. The assembly of claim 48, wherein the means for generating the light beam comprises a VCSEL laser chip.

54. The assembly of claim 48, wherein the means for receiving reflected light from the target comprises a CCD device.

55. The assembly of claim 48, wherein the scanner is capable of range of oscillation of +/−20° relative to a central rest position.

* * * * *

UNITED STATES PATENT AND TRADEMARK OFFICE

CERTIFICATE OF CORRECTION

PATENT NO. : 7,017,815 B2 Page 1 of 1
DATED : March 28, 2006
INVENTOR(S) : Frederick F. Wood It is certified that error appears in the above-identified patent and that said Letters Patent is hereby corrected as shown below:

<u>Title page,</u>
Item [74], *Attorney, Agent, or Firm*, "Carter, DeLuca, Farelll & Schmidt, LLP" should read -- Carter, DeLuca, Farrell & Schmidt, LLP --.

Signed and Sealed this

Sixth Day of June, 2006

JON W. DUDAS
*Director of the United States Patent and Trademark Office*